US008069382B2

(12) United States Patent
Aritome

(10) Patent No.: US 8,069,382 B2
(45) Date of Patent: *Nov. 29, 2011

(54) MEMORY CELL PROGRAMMING

(75) Inventor: Seiichi Aritome, Zhudong (TW)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 12/960,260

(22) Filed: Dec. 3, 2010

(65) Prior Publication Data

US 2011/0083050 A1    Apr. 7, 2011

Related U.S. Application Data

(63) Continuation of application No. 11/926,713, filed on Oct. 29, 2007, now Pat. No. 7,853,841.

(51) Int. Cl.
   *G11C 29/00* (2006.01)
(52) U.S. Cl. .................................. 714/721; 714/719
(58) Field of Classification Search .......... 365/185.09, 365/185.22, 185.28, 185.29; 714/718, 721, 714/719
   See application file for complete search history.

(56) References Cited

U.S. PATENT DOCUMENTS

| 5,646,891 | A | 7/1997 | Okamoto | |
| 5,889,744 | A | 3/1999 | Iwanaga | |
| 5,978,275 | A * | 11/1999 | Song et al. | 365/185.29 |
| 6,490,204 | B2 * | 12/2002 | Bloom et al. | 365/185.28 |
| 6,643,181 | B2 * | 11/2003 | Sofer et al. | 365/185.22 |
| 6,665,214 | B1 | 12/2003 | Cheah et al. | |
| 6,937,521 | B2 * | 8/2005 | Avni et al. | 365/185.22 |
| 7,171,513 | B2 | 1/2007 | Gonzalez et al. | |
| 7,512,014 | B2 | 3/2009 | Tran et al. | |
| 7,630,255 | B2 * | 12/2009 | Yang | 365/185.29 |
| 7,679,961 | B2 | 3/2010 | Lee et al. | |
| 2005/0172065 | A1 | 8/2005 | Keays | |
| 2006/0248434 | A1 | 11/2006 | Radke et al. | |
| 2007/0091677 | A1 * | 4/2007 | Lasser et al. | 365/185.09 |

* cited by examiner

*Primary Examiner* — David Ton
(74) *Attorney, Agent, or Firm* — Brooks, Cameron & Huebsch, PLLC

(57) ABSTRACT

Embodiments of the present disclosure provide methods, devices, and systems for performing a programming operation on an array of non-volatile memory cells. One method includes programming a number of cells to a number of final data states. The method includes performing, prior to completion of, e.g., finishing, the programming operation, an erase state check on a subset of the number of cells, which were to be programmed to an erased state.

25 Claims, 9 Drawing Sheets

MEMORY CELL PROGRAMMING

CROSS-REFERENCE TO RELATED APPLICATIONS

This application is a Continuation of U.S. patent application Ser. No. 11/926,713, filed Oct. 29, 2007, the specification of which is incorporated by reference herein.

TECHNICAL FIELD

The present disclosure relates generally to semiconductor memory devices and, more particularly, in one or more embodiments, to memory devices having non-volatile memory cells.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged. In the NOR array architecture, the floating gate memory cells of the memory array are typically arranged in a matrix.

The gates of each floating gate memory cell of the array matrix are typically coupled by rows to word lines and their drains are coupled to column bit lines. The NOR architecture floating gate memory array is accessed by a row decoder activating a row of floating gate memory cells by selecting the word line coupled to their gates. The row of selected memory cells then place their data values on the column bit lines by flowing different currents depending on if a particular cell is in a programmed state or an erased state.

A NAND array architecture also arranges its array of floating gate memory cells in a matrix such that the gates of each floating gate memory cell of the array are coupled by rows to word lines. However each memory cell is not directly coupled to a column bit line by its drain. Instead, the memory cells of the array are coupled together in series, source to drain, between a source line and a column bit line.

Memory cells in a NAND array architecture can be programmed to a desired state. For example, electric charge can be placed on or removed from the floating gate of a memory cell to put the cell into a number of data states. For example, a single level cell (SLC) can represent two binary states, e.g., 1 or 0. Flash memory cells can also store more than two binary states, e.g., 00, 01, 10, or 11. Such cells may be referred to as multi state memory cells, multibit cells, or multilevel cells (MLCs). MLCs can allow the manufacture of higher density memories without increasing the number of memory cells since each cell can represent more than one bit. MLCs can have more than one programmed state, e.g., a cell capable of representing two bits can have three programmed states and an erased state.

Reading of memory cells can be accomplished by applying an appropriate voltage to the control gate and the drain and comparing the drain to source current, which can indicate the voltage threshold (Vt) of the cell, against a reference current, e.g., a "trip point," to determine the state of the memory cell. In an example data read operation, e.g., 0 volts can be applied to a selected word line, e.g., to the control gate of a cell or cells in the selected word line. A read pass voltage, e.g., 5 volts, can be applied to unselected word lines, e.g., to the control gates of cells in the unselected word lines. The drain to source current, e.g., the "cell current," or "drain current," flowing through cells on the selected word line, is indicative of the binary logic state of the cell.

As such, when the cell current of a particular memory cell is above the trip point, the memory cell is read as having a particular state, e.g., an erased state or a programmed state. When the cell current of the particular memory cell is below the trip point, the memory cell is read as having a different state. Therefore, a desired configured state of the memory cell, e.g., 00, 01, 10, or 11, depends on whether the cell current is above or below the trip point.

Memory cells having a state other than their desired/expected configured state, e.g., the state into which they were programmed, represent data errors in data being read. Many memory devices and/or systems employ an error checking technique such as error correction code (ECC) checking to detect bit errors in data, e.g., cells having incorrect states. The error correction codes can be associated with groups of cells, e.g., memory blocks, memory segments, or memory sectors, and can reduce read failures by detecting and possibly correcting bit errors. Examples of error correction codes include, Hamming codes, Reed-Solomon (RS) codes, Bose-Chaudhuri-Hochquenghem (BCH) codes, circular redundancy check (CRC) codes, Golay codes, Reed-Muller codes, Goppa codes, and Denniston codes, among others.

Read failures occur when accessed data bits, e.g., memory cells representing information retrieved by a processor, have incorrect states. Reducing read failures increases the operational reliability of memory devices and/or systems. Error checking/correcting techniques may not be able to correct more than a certain number of erroneous bits. Furthermore, many error checking techniques may not even be able to detect more than a particular number of erroneous bits for a given group of cells, e.g., a data word or data sector.

Therefore, the read failure rate increases as the number of memory cells having incorrect states increases. The state of a memory cell can be incorrect for several reasons. For example, floating gate to floating gate interference from adjacent cells can shift the Vt of a memory cell, which can in turn result in a modified cell current. This cell current modification can cause the cell to switch from a correct state to an incorrect state. The Vt shifts and associated cell current shifts caused by interference can have a greater effect on a cell programmed to the erased state when adjacent cells are programmed to higher data states. Vt shifts and cell current modification affect greater numbers of cells as cell read margins are reduced as scaling of memory devices shrinks in dimension, etc.

DETAILED DESCRIPTION

Embodiments of the present disclosure provide methods, devices, and systems for performing a programming operation on an array of non-volatile memory cells. One method includes programming a number of cells to a number of final data states. The method includes performing, prior to completion of, e.g., finishing, the programming operation, an erase state check on a subset of the number of cells, which were to be programmed to an erased state. In some embodiments, a subset can include only one cell.

Figure 1:
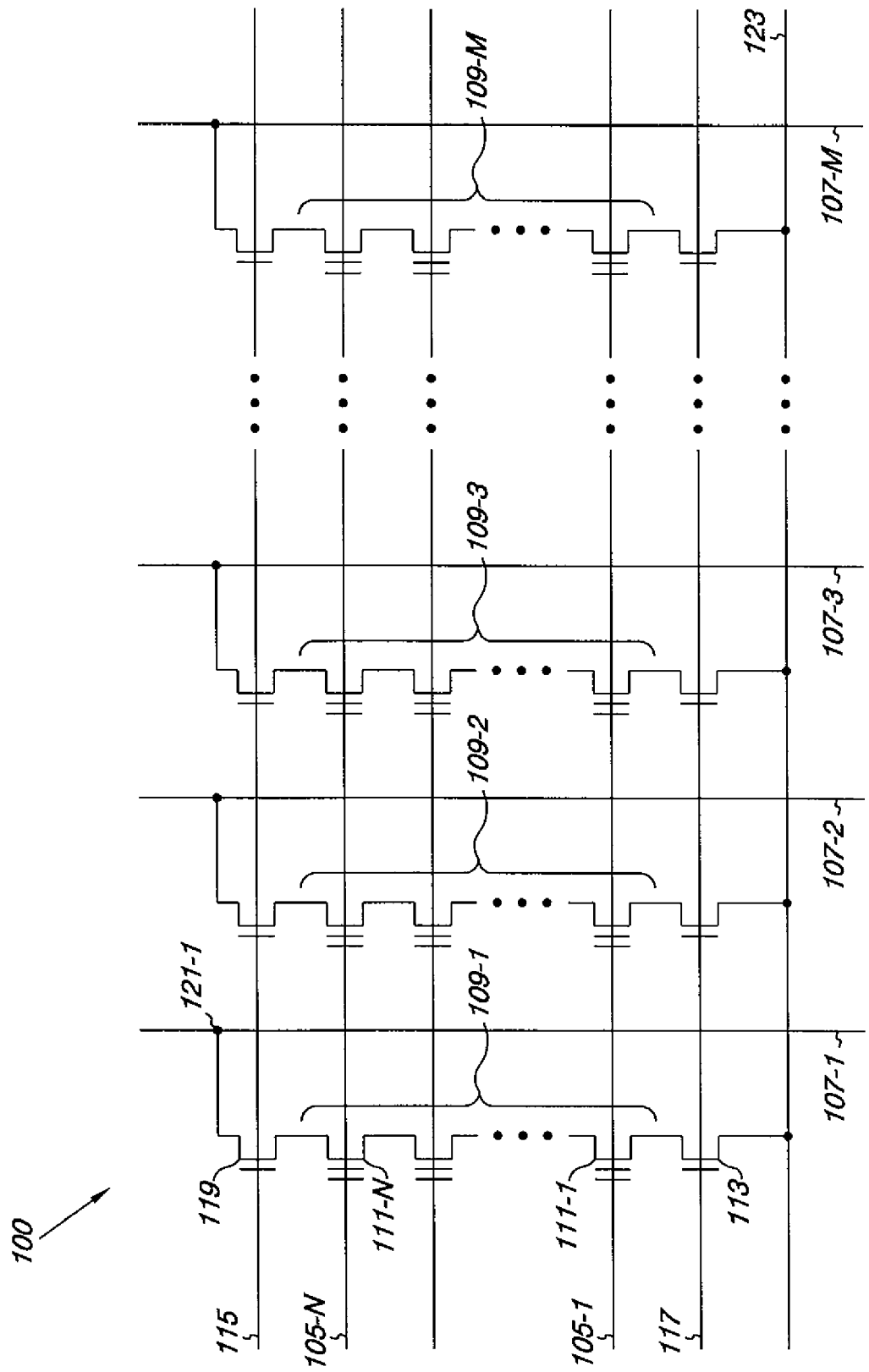
FIG. 1 is a schematic of a portion of a non-volatile memory array that can be used with embodiments of the present disclosure.

FIG. 1 is a schematic of a portion of a non-volatile memory array 100 that can be used with embodiments of the present disclosure. The embodiment of FIG. 1 illustrates a NAND architecture non-volatile memory. However, embodiments described herein are not limited to this example. In some embodiments, the array 100 includes some multilevel memory cells (MLCs).

As shown in FIG. 1, the memory array 100 includes word lines 105-1, ..., 105-N and intersecting bit lines 107-1, ..., 107-M. For ease of addressing in the digital environment, the number of word lines 105-1, ..., 105-N and the number of bit lines 107-1, ..., 107-M are each some power of two, e.g., 256 word lines by 4,096 bit lines. The indicators "M" and "N" are used to indicate that the array 100 can include a number of word lines and a number of bit lines.

Memory array 100 includes NAND strings 109-1, ..., 109-M. Each NAND string includes non-volatile memory cells 111-1, ..., 111-N, each located at an intersection of a word line 105-1, ..., 105-N and a local bit line 107-1, ..., 107-M. The non-volatile memory cells 111-1, ..., 111-N of each NAND string 109-1, ..., 109-M are connected in series source to drain between a select gate source (SOS) transistor, e.g., a field-effect transistor (FET) 113, and a select gate drain (SGD) transistor, e.g., FET 119. Source select gate 113 is located at the intersection of a local bit line 107-1 and a source select line 117 while drain select gate 119 is located at the intersection of a local bit line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local bit line 107-1 for the corresponding NAND string 109-1 at drain contact 121-1. The source of drain select gate 119 is connected to the drain of the last memory cell 111-N, e.g., floating-gate transistor, of the corresponding NAND string 109-1.

In some embodiments, construction of non-volatile memory cells 111-1, ..., 111-N includes a source, a drain, a floating gate or other charge storage layer, and a control gate. Non-volatile memory cells, 111-1, ..., 111-N, have their control gates coupled to a word line, 105-1, ..., 105-N, respectively. A column of the non-volatile memory cells 111-1, ..., 111-N make up the NAND strings, e.g., 109-1, ..., 109-M, coupled to a given local bit line, e.g., 107-1, ..., 107-M, respectively. A row of the non-volatile memory cells are commonly coupled to a given word line, e.g., 105-1, ..., 105-N. An AND array architecture would be similarly laid out except that the string of memory cells would be coupled in parallel between the select gates.

Some embodiments of the present disclosure can be used to reduce read failures associated with operating an array of non-volatile memory cells, e.g., array 100, for cells programmed to the erased state.

Figure 2A:
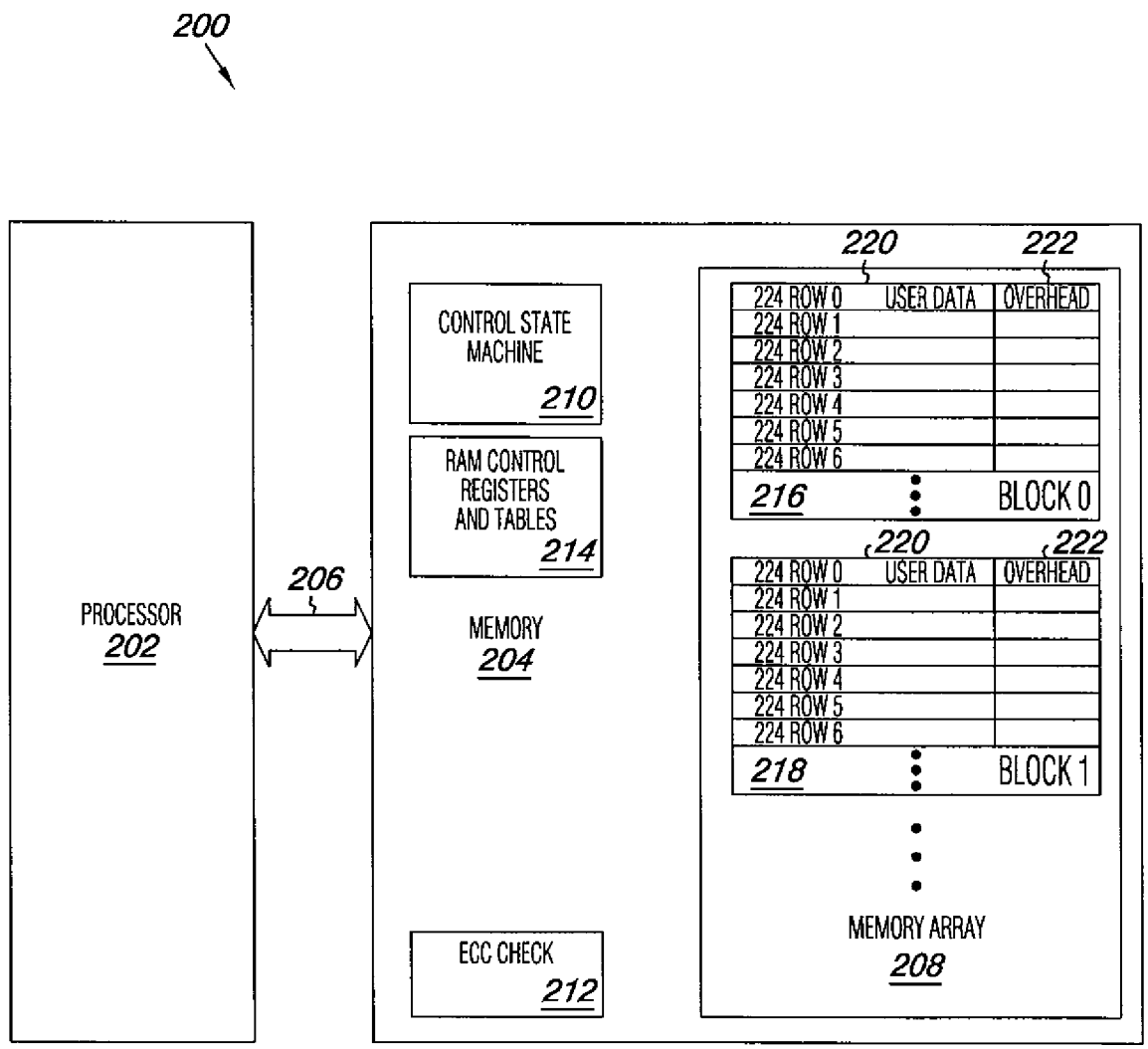
FIG. 2A is a block diagram of an electronic system having a memory device in accordance with an embodiment of the present disclosure.

FIG. 2A is a block diagram of an electronic system 200 having a memory device 204 in accordance with an embodiment of the present disclosure. In the system 200, the memory device 204 is coupled to a processor 202 with an address/data bus 206. In the embodiment of FIG. 2A, the memory device 204 includes a control state machine 210 that directs internal operation of the memory device 104. The control state machine 210 can perform functions including managing the memory array 208 and updating RAM control registers and tables 214, among some other functions.

The memory array 208 contains floating gate memory cells arranged in a sequence of memory blocks 216, 218. The blocks 216, 218 contain a series of physical pages/rows (shown as "Row 0," "Row 1," etc.), each page containing one or more logical "sectors" 224 (shown here for illustration purposes as a single logical sector 224 per physical page/row) that contain a user data space 220 and an overhead, e.g., control data space 222 (shown as "OVERHEAD"). The overhead data space 222 contains overhead information for operation of the sector 220, such as error correction data, status flags, or an erase block management data field area (not shown).

The RAM control registers and tables 214 can be loaded at power up from the non-volatile erase block management registers and tables (not shown) by the control state machine 210. The user data space 220 in each logical sector 224 can be 512 bytes long. It is noted that other interfaces to the Flash memory 204 and formats for the blocks 216, 218, physical pages, and sectors 224 are possible. For example, the physical pages of the memory blocks 216, 218 can include multiple sectors 224 which can include more or less than 512 bytes of data. In the embodiment shown in FIG. 2A, the memory device 204 contains ECC checking hardware 212 that can be used in conjunction with some embodiments of the present disclosure.

Figure 2B:
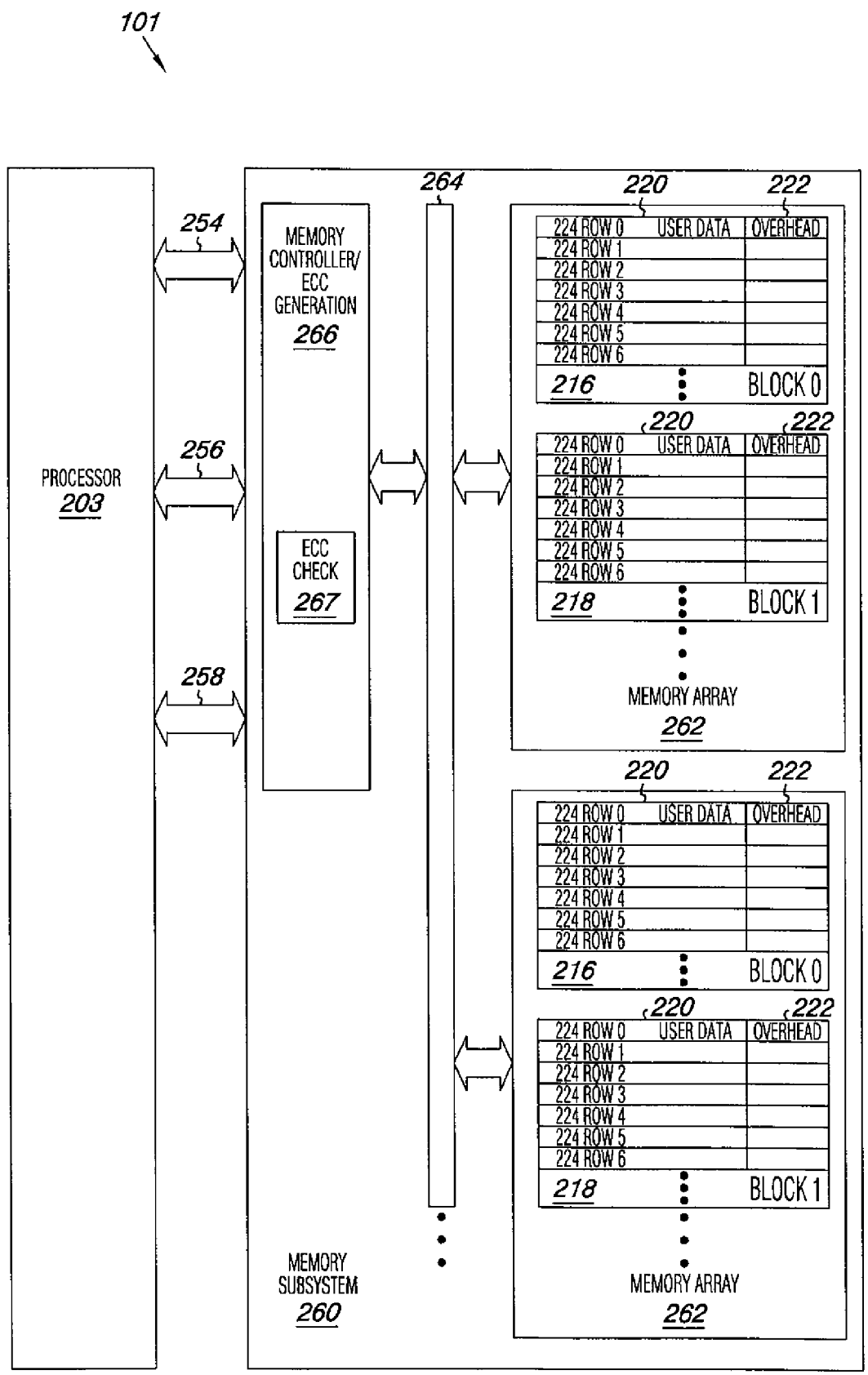
FIG. 2B is a block diagram of another electronic system having a memory device in accordance with an embodiment of the present disclosure.

When memory cells are read, an ECC check can be performed to reduce and or prevent read failures. Some error correction codes include, Hamming codes, Reed-Solomon (RS) codes, Bose-Chaudhuri-Hochquenghem (BCH) codes, circular redundancy check (CRC) codes, Golay codes, Reed-Muller codes, Goppa codes, and Denniston codes. As an example, when a sector of data in a memory array, e.g., array 208 in FIG. 2A, is programmed, the appropriate error correction data is generated and stored in the bits reserved for them, i.e., in overhead data space 222. When the sector is read back, the user data 220 read, combined with the error correction data in overhead data space 222, can tell the controller 210 if any errors occurred during the read. Errors that can be corrected by the ECC check 267, shown in FIG. 2B, are corrected before passing the data to the rest of the system. Many ECC circuits 267 system can tell when there is too much damage to the data to correct, and will issue an error notification, e.g., an ECC failure and/or read failure, in that event.

The number of bits (cells) that are correctable depends on the particular ECC algorithm used. Embodiments of the present disclosure are not limited to any one particular ECC technique, and some embodiments can employ multiple different error checking techniques. As one example, the capability of a Reed Solomon ECC implementation is based on the number of additional error correction bits it includes, e.g., on the number of bits in the overhead data 222. The more overhead bits 222 included for a given amount of user data 220, the more errors that can be determined and/or corrected.

FIG. 2B is a block diagram of another electronic system 201 having a memory device in accordance with an embodiment of the present disclosure. In the embodiment illustrated in FIG. 2B, the electronic system 201 includes a memory subsystem 260, e.g., a flash memory card, coupled to a processor 203 with an address 254, control 256, and data bus 258. In this embodiment, the memory subsystem 260 includes a memory controller 266 which can direct internal operation of the subsystem 260. The memory controller 266 can perform functions such as managing the memory arrays 262, directing data accesses, updating internal control registers and tables (not shown), and/or directing operation of other possible hardware systems (not shown) of the memory subsystem 260.

In some embodiments, and as shown in the embodiment of FIG. 2B, the memory controller 266 includes internal ECC checking hardware 267 that can be used in conjunction with embodiments of the present disclosure. The memory controller 266 may optionally incorporate a small local embedded processor to help manage the memory subsystem 260. The memory controller 266 is coupled to and controls one or more memory arrays 262 via an internal control bus 264. Memory arrays 262 can include flash memory arrays, e.g., NAND or NOR arrays, and/or other arrays of non-volatile memory cells. It is noted that other memory architectures, memory systems 260, external interfaces 254, 256, 258, and manners of coupling the memory controller 266 to the memory arrays 262, such as directly coupled individual control busses and signal lines, are possible and should be apparent to those of ordinary skill in the art.

In the embodiment illustrated in FIG. 2B, the memory arrays 262 each contain a sequence of memory blocks 216, 218 in their internal memory arrays. Each block 216, 218 contains a series of physical pages, each physical page having one or more logical sectors 224 that contain a user data space 220 and a control/overhead data space 222 (shown as "OVERHEAD"). The overhead data space 222 can contain error correction data and/or other overhead information for operation of the logical sectors 224, such as status flags, or a memory block management data field area (not shown). For illustration, each physical page/row (shown as "Row 0," "Row 1," etc.) in the embodiment of FIG. 2B includes a single logical sector 224. However, embodiments can have several logical sectors, e.g., 4, 8, 10, 12, or 16 logical sectors, among other numbers of logical sectors.

Figure 3:
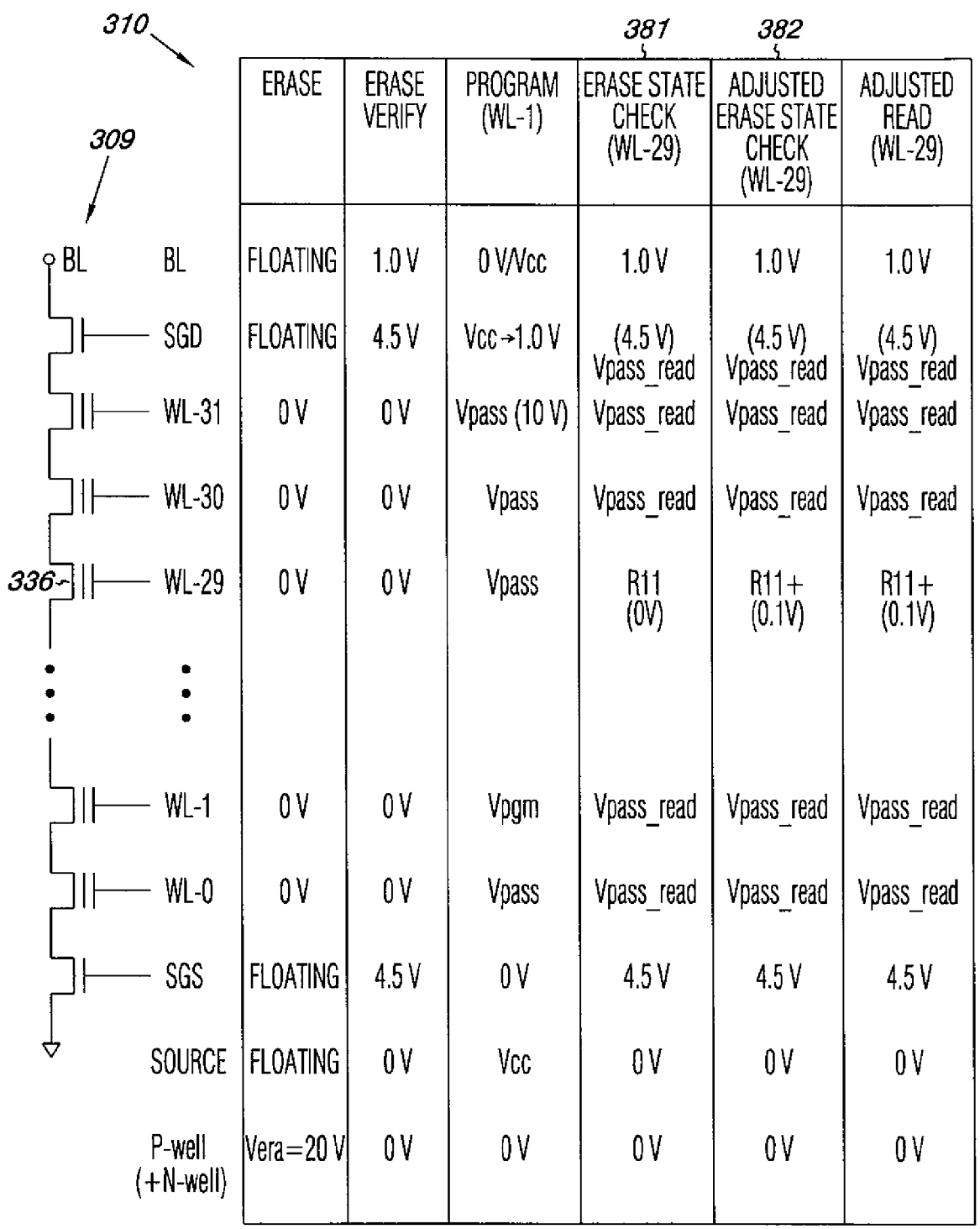
FIG. 3 illustrates a table of operating voltages that can be used in accordance with an embodiment of the present disclosure.

FIG. 3 illustrates a table 310 of operating voltages that can be used in accordance with an embodiment of the present disclosure. The table 310 illustrates voltages applied to a bit line (BL), a drain select line (SGD), a number of word lines (WL-0 through WL-31), a source select line (SGS), a common source line (SOURCE), and a substrate body (P-well) associated with a string 309 of non-volatile memory cells coupled in series between a select gate source transistor and a select gate drain transistor. The table 310 illustrates examples of voltages applied to the string 309 during an erase operation (ERASE) and an erase verify operation (ERASE VERIFY) performed on the string 309. The table 310 also illustrates operating voltages for a program operation (PROGRAM), an erase state check operation (ERASE STATE CHECK), an adjusted erase state check operation (ADJUSTED ERASE STATE CHECK), and an adjusted read operation (ADJUSTED READ) associated with programming and reading a memory cell of the string 309, e.g., a cell coupled to WL-29 in this example.

In one erase state check operation embodiment, a first select gate transistor, e.g., a select gate source transistor, coupled to a string of memory cells is biased at a first voltage while a second select gate transistor, e.g., a select gate drain transistor, coupled to the string is biased at a second voltage. In some embodiments, and as shown in FIG. 3, the first and the second voltages applied to the first and second select gate transistors can be the same voltage, e.g., 4.5V (Vpass_read) in this example.

In an embodiment of an erase state check operation, 381, a read reference voltage associated with the erased state, e.g., R11, is applied to a word line, e.g., WL-29, in order to determine if a cell on that line is programmed to the erased state 11. In some embodiments, the erase state check voltage applied to the word line, e.g., WL-29 in this example, can be 0V. Embodiments are not so limited.

In another embodiment of an erase state check operation, 382, the read reference voltage applied to word lines to read the erased state, R11+, is increased from the erase state check read reference voltage R11. For example, in one embodiment, the adjusted read reference voltage, R11+, is 0.1V, and R11 is 0V. As will be discussed below in connection with FIGS. 6A and 6B, the adjusted read reference voltage associated with the erased state should help to compensate for floating gate to floating gate interference, which can cause the Vt of cells in the erased state to increase such that it is above the R11 level. Reading or checking a cell that is in the erased state at an elevated voltage, e.g. R11+, can prevent the cell from being read in the wrong state.

In some embodiments, and as shown in FIG. 3, the same adjusted erase state check voltage, R11+, is also used as an adjusted read reference voltage, R11+, for subsequent reading operations. As will be appreciated by one of skill in the art, an adjusted voltage, R11+, that allows a cell in the erased state to be checked correctly, is also needed for the cell to be read in the correct state after the cell has been programmed. In this case, the adjusted erase state check voltage and the adjusted read reference voltage are equal, e.g., 0.1V. However, these voltages could differ as embodiments are not so limited.

Figure 4:
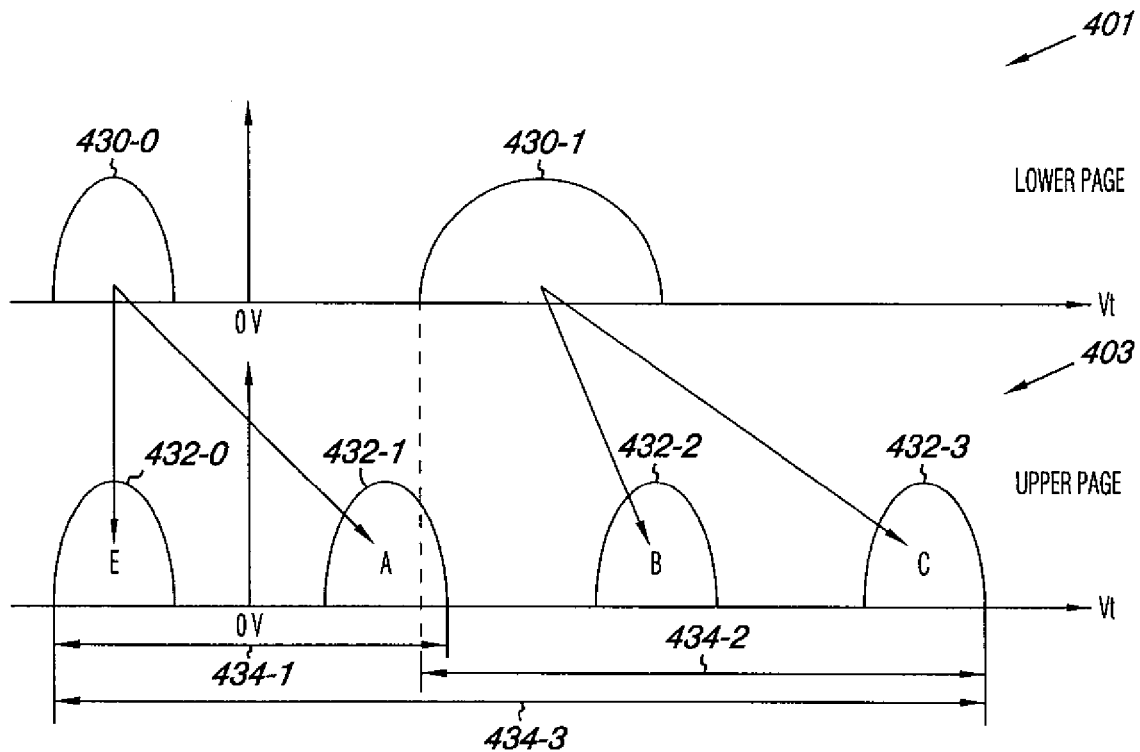
FIG. 4 illustrates a diagram of threshold voltage (Vt) distributions for programming to a particular data state in accordance with embodiments of the present disclosure.

FIG. 4 illustrates a diagram of threshold voltage (Vt) distributions for programming to a particular data state in accordance with embodiments of the present disclosure. FIG. 4 illustrates (Vt) distributions, e.g., Vt ranges, of memory cells in an array of non-volatile memory cells, e.g., array 100 in FIG. 1. FIG. 4 illustrates Vt distributions of the memory cells after a lower page programming process 401 and an upper page programming process 403 associated with a programming operation embodiment. After the programming operation each of the memory cells of a physical page of data are programmed to one of four logical states. That is, in this embodiment, each memory cell is assumed to be a two-bit MLC. However, embodiments of the present disclosure are not limited to MLCs representing 2 bits/cell, e.g., in some embodiments the MLCs may represent more or fewer than 2 bits/cell.

In the embodiment illustrated in FIG. 4, lower page programming 401 is performed first and the upper page programming process 403 is performed last. That is, logical lower pages are programmed prior to logical upper pages. However, embodiments are not so limited. For example, in some embodiments, the first logical lower page may be referred to as an "upper page" or as a "first lower page" since in some embodiments the logical upper pages can be programmed first and the first logical lower pages can be programmed last.

As shown in the embodiment of FIG. 4, for lower page programming, a memory cell is programmed to a threshold voltage (Vt) level within a first Vt distribution 430-0, corresponding to an erase state, or to a second Vt distribution 430-1. As one of ordinary skill in the art will appreciate, "programming" a cell to the erased state means that, after the cell is erased during an erase operation, it is left in the erased state when other cells are programmed to higher states. In this example, for upper page programming, the cells for the erased state, e.g., the first data state, 432-0 ("E") and the second data state 432-1 ("A") are programmed from Vt 430-0 in the lower page. Cells programmed to the third data state 432-2 ("B") and fourth data state 432-3 ("C") are programmed from Vt 430-1 in the lower page.

As is also shown in the embodiment of FIG. 4, line 434-1 represents the difference in threshold voltage Vt between a cell in the erased state, e.g., the first data state, 432-0 and a cell in the second data state, e.g. 432-1. The line 434-2 represents the Vt difference between a cell in the second data state, e.g. 432-1 and a cell in the fourth data state, e.g. 432-3. The line 432-3 represents the Vt difference between a cell in the erased state, e.g., the first data state, 432-0 and a cell in the fourth data state, e.g. 432-3. Line 434-2 is shorter than line 434-3 indicating that there is a smaller Vt difference between cells when a cell is programmed from the second data state A to the fourth data state C rather than from the erased state, e.g., the first data state, E to the fourth data state C. Using lower 401 and upper page 403 programming can reduce floating gate—floating gate interference between cells during programming by reducing the Vt difference between cells as they are programmed. However, this method will not reduce interference between a cell that is being programmed and a cell that is left in the erased state because the Vt difference between the erased state and the cell in its final data state will be the same regardless of an intermediate, lower page 401, programming step. The line 434-3 also indicates that a cell programmed to the highest data state, e.g. C in this embodiment, that is adjacent to a cell programmed in the erased state E has the greatest Vt difference and greatest ability to cause floating gate—floating gate interference between the cells.

Figure 5:
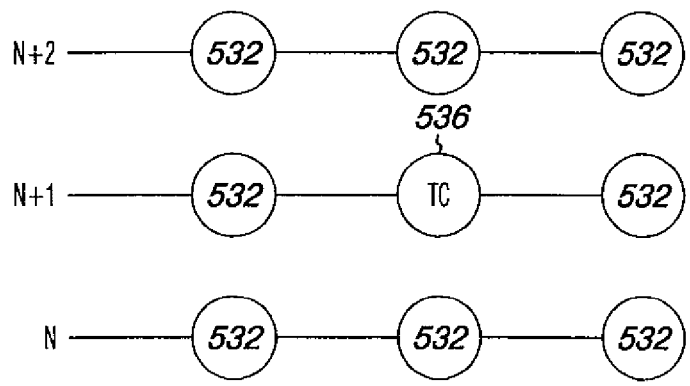
FIG. 5 illustrates a target cell and adjacent cells in a non-volatile memory array that can be used with embodiments of the present disclosure.

FIG. 5 illustrates a target cell and adjacent cells in a non-volatile memory array that can be used with embodiments of the present disclosure. Each of the cells is on a word line, N, N+1, or N+2. In this illustration, the word line N is adjacent to word line N+1. Word line N+1 is adjacent to word line N+2, etc. Target cell 536, in this embodiment, is programmed to the erased state. The adjacent cells 532, can be programmed to various states. The difference in threshold voltages Vt between the target cell 536 and adjacent cells 532 causes floating gate—floating gate interference where the Vt of the target cell is shifted up. The scenario having the largest effect on target cell 536 is when all adjacent cells 532 are programmed to the highest data state, e.g. the fourth data state as illustrated in FIG. 4. In that scenario, the Vt difference between the target cell 536 and adjacent cells 532 is largest, causing the most interference.

Figure 6A:
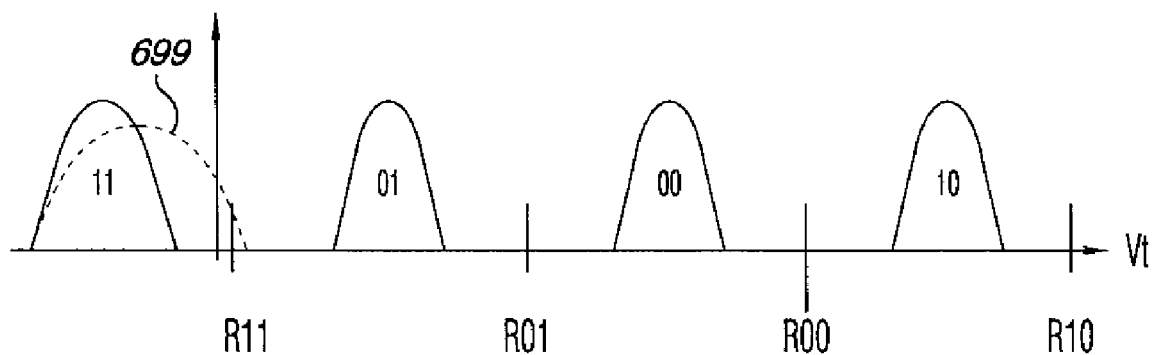
FIG. 6A illustrates a distribution of voltage thresholds and read reference voltages of a group of non-volatile memory cells that have been individually programmed into one of four states according to an embodiment of the present disclosure.
Figure 6B:
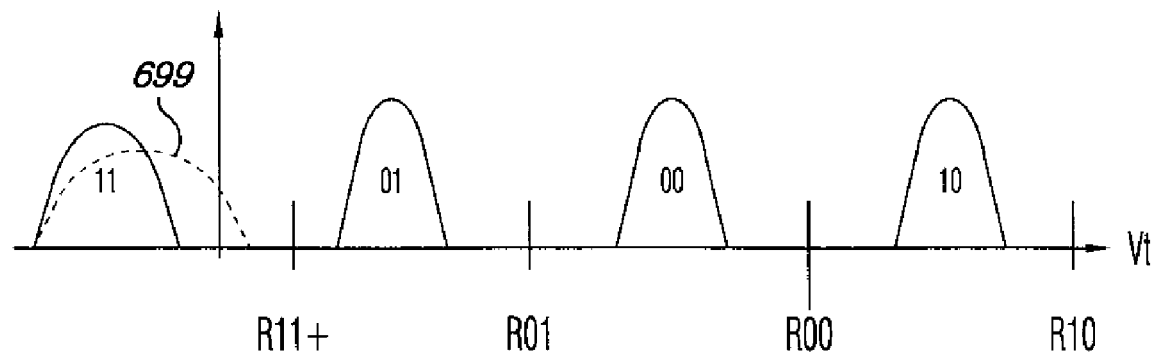
FIG. 6B illustrates a distribution of voltage thresholds and read reference voltages, including an adjusted read reference voltage associated with the erased state, of a group of non-volatile memory cells that have been individually programmed into one of four states according to an embodiment of the present disclosure.

FIGS. 6A and 6B illustrate diagrams of threshold voltage (Vt) distributions for programming to a particular data state in accordance with one or more embodiments of the present disclosure. Although there are many forms of memory cells having some numbers of states per memory cell, an array with four states per memory cell (e.g., a storage element) has been chosen for illustrative purposes. In such arrays, two bits of data can be stored in each memory cell.

In the embodiment represented by the illustrations of FIGS. 6A and 6B, the programmed storage elements form memory cell transistors with threshold levels that fall into one of four threshold distributions, e.g., 11, 01, 00, or 10. The distribution 11 represents the erased state, which is sometimes referred to as the erase level, and is also one of the programmed states. The distribution 11 reflects cells having a negative threshold voltage Vt.

The distribution ranges 01, 00, and 10 reflect cells having positive threshold voltages. In the embodiments of FIGS. 6A and 6B, the distribution 01 represents data bits having a second programmed state. The distribution 00 represents data bits having a third programmed state, and the distribution 10 represents data bits having a fourth programmed state. The distributions 01, 00, and 10 can be referred to as program levels. An additional number of states, and thus more bits, may be programmed into each storage element. That is, embodiments are not limited to a system with four states, e.g., one erase level and three program levels.

Upon programming user data and/or block overhead data into a number of memory cells forming all or a portion of a memory block, programming voltage pulses are applied to those cells whose state is to be changed from the erase state, e.g., "11", to something else. For those transistors to be programmed into state "01" out of erase state "11", the pulsing is terminated when their Vt fall within the distribution 01. The states of the cells can be verified in between the programming pulses. However, the state of cells in the erased, 11, state can not be verified in that manner because those cells are left in the 11 state after an erase operation. There are no programming pulses applied to cells left in the 11 state as there are to cells programmed to higher states.

Similarly, pulsing is terminated for those storage transistors programmed into the "00" state when their Vt fall within the distribution 00. Finally, for those storage element transistors programmed into the "10" state, the program pulses are terminated when their Vt fall within the distribution 10.

FIGS. 6A and 6B also illustrate the read reference voltages used to determine into which of the four threshold states the cell has been programmed. The read reference voltage levels R01, R00, and R10 are reference voltages used to read the "01", "00" and "10" storage states, respectively. These are the read reference voltages associated with the threshold voltage of each data state. Determination of data states can be accomplished by comparing a current, e.g., drain current (Id), or voltage threshold (Vt) measured from the cell with reference currents or voltages, respectively.

FIG. 6A illustrates a distribution of voltage thresholds and read reference voltages of a group of non-volatile memory cells that have been individually programmed into one of four states according to an embodiment of the present disclosure. FIG. 6A illustrates a diagram of a memory cell programmed into the "11" state undergoing a Vt shift above the read reference level R11, e.g., the dashed line 699. In this example, the memory cell would be read as being in an incorrect state, e.g., the "01" state. As mentioned above, such data errors can be detected and corrected by one or more embodiments of the present disclosure.

FIG. 6B illustrates a distribution of voltage thresholds and read reference voltages, including an adjusted read reference voltage associated with the erased state, of a group of non-volatile memory cells that have been individually programmed into one of four states according to an embodiment of the present disclosure. FIG. 6B illustrates a diagram of a memory cell programmed into the "11" state where the Vt level increases, e.g., the dashed line 699. However, according to an embodiment of the present disclosure, the read reference level for the erased state, 11, has been adjusted to R11+. When the cell is read or erase state checked, it will correctly indicate that it is in the erased state, 11. As such, the embodiment represented by FIG. 6B can reduce or prevent read errors associated with floating gate to floating gate interference from adjacent cells.

Figure 7:
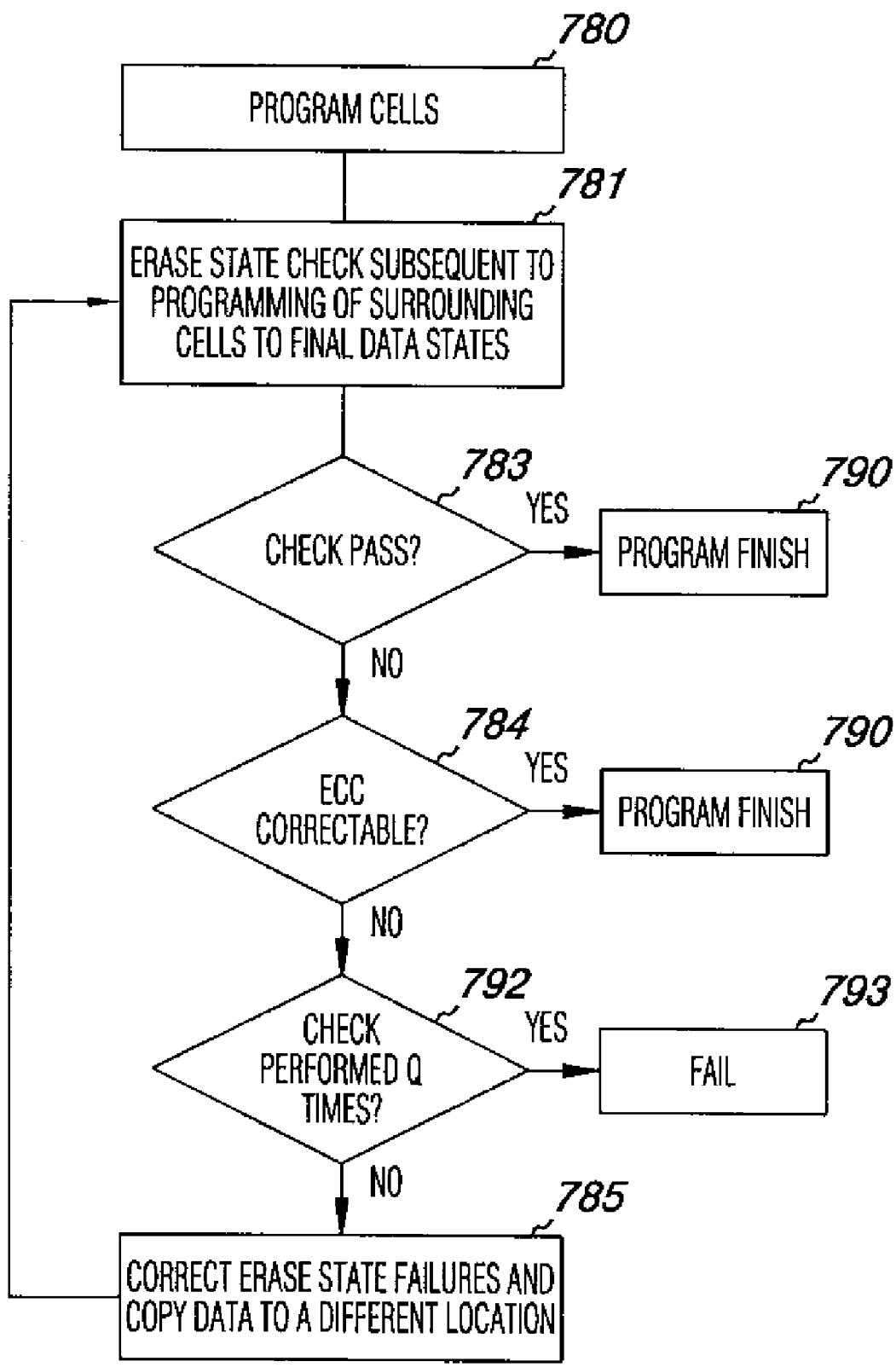
FIG. 7 illustrates a flow diagram for performing program operations according to an embodiment of the present disclosure.
Figure 8:
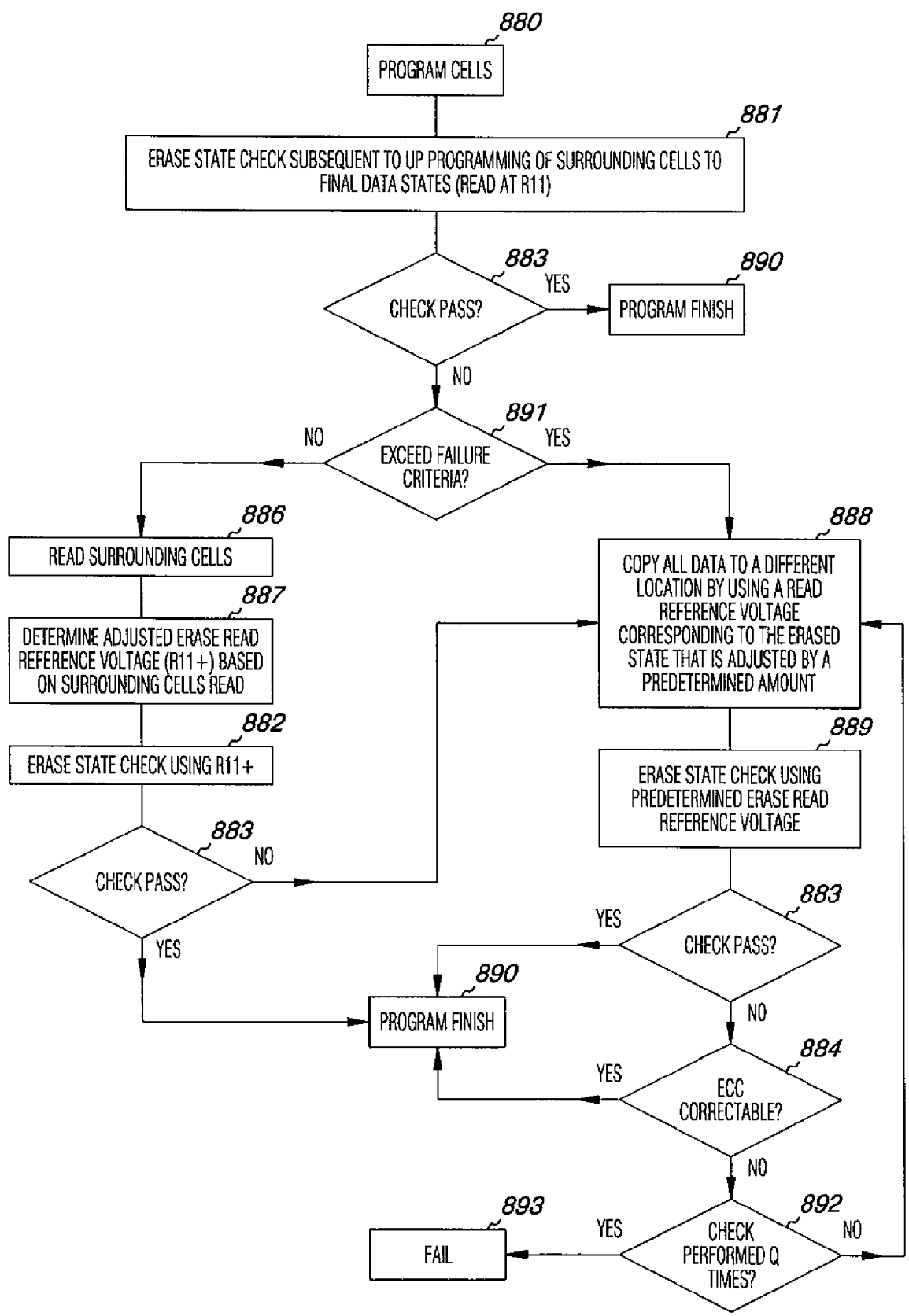
FIG. 8 illustrates another flow diagram for performing program operations according to an embodiment of the present disclosure.

FIGS. 7-8 illustrate various flow diagrams for performing program operations according to embodiments of the present disclosure. Embodiments illustrated herein can be performed by logic and/or computing device executable instructions as the same will be understood by one of ordinary skill in the art upon reading this disclosure. The methods described by the flow diagrams are capable of performing erase state checks of cells programmed to the erased state in order to reduce read failures caused by floating gate—floating gate interference from adjacent cells programmed to higher data states. Also, as described below, some embodiments can be used to adjust a read reference voltage to be used in subsequent read or erase state check operations. One or more embodiments of the present disclosure can adjust a read reference voltage resulting in an increased number of cells being read in the erased state rather than an incorrect higher state. Embodiments can also accommodate an increased capability for bit corrections by an error checking technique. That is, an increased number of correctly read cells can reduce the number of bits which remain to be corrected by a ECC technique and/or may reduce the number of erroneous bits to within a threshold number of erroneous bits that is correctable by the ECC.

In the embodiments illustrated in FIGS. 7-8, the cells being programmed are in a NAND memory array. During an erase state check operation, a pass read potential (Vpass_read in FIG. 3), e.g. 4.5 volts, is applied to each word line in the NAND string that is not being erase state checked. It is also assumed that an erase state check potential (R11 or R11+ in FIG. 3), e.g., 0 volts or 0.1 volts, is applied to cells that are being checked for programming to the erased state. Embodiments, however, are not limited to these example architectures and/or potentials. That is, various embodiments can include memory architectures other than NAND architectures and embodiments are not limited to an erase state check potential of 0V or 0.1V or a pass read potential of 4.5V. Furthermore, embodiments are not limited to having the same potential applied to each of the word lines in a non-volatile memory cell string.

FIG. 7 illustrates a flow diagram for performing program operations according to an embodiment of the present disclosure. At step 780 a number of cells are programmed to various final data states. This can include leaving a number of cells in the erased state, which is also referred to as programming a cell to the erased state. The program can be initiated by a control state machine, a memory controller, a processor, etc., associated with the memory array. In various embodiments, a control state machine, controller, etc., and memory array can be integrated into a single chip and/or may be interconnected by buses, among other types of arrangements, etc. The program initiation can result in the generation of a program address, which can be decoded by support circuitry associated with the memory array.

At step 781 an initial erase state check operation is performed subsequent to programming of surrounding cells to final data states. The erase state check is performed at an initial erase state check potential R11, e.g., using an initial erase state check potential of about 0 volts, by applying the initial erase state check potential to the selected word line being checked. That is, the selected cell or cells, e.g., data word, which were programmed to the erased state, corresponding to the requested read address can be checked by having a selected word line potential applied to their associated word line and an initial pass read potential (Vpass_read in FIG. 3) applied to the unselected word lines in the array in order to determine the states of the selected cell or cells.

At step 783 the data from selected cells is checked to determine whether the cells are in the erased state. The erase state check can be implemented in hardware and/or software, and can be performed by circuitry on a memory chip that includes one or more memory arrays. Alternatively, the erase state check can be performed by circuitry of a controller that may or may not be located on a memory chip.

In the event that the erase state check passes, the programming operation can finish at step 790. An erase state check pass can occur when the data indicates that the cell or cells are correctly programmed to the erased state.

On the other hand, if the erase state check does not result in an erase state check pass, e.g., the checked data indicates that the cell or cells are programmed to a data state other than the erased state, then a check is performed at step 784 of whether the erroneous bits are correctable by an error correction code (ECC) technique. The ECC check can be implemented in hardware and/or software, and can be performed by circuitry on a memory chip that includes one or more memory arrays. Alternatively, the ECC check can be performed by ECC circuitry of a controller that may or may not be located on a memory chip. However, performing the ECC checks on chip may be beneficial due to the increased checking time associated with off chip ECC checking.

In the event that the ECC check passes, the programming operation can finish at step 790. An ECC check pass can occur when the data being read contains a number of erroneous bits which are correctable by the ECC. The threshold number of bits correctable by an ECC can depend on the particular ECC technique or techniques being employed. Some ECC techniques can correct for single bit errors, while others can correct for double bit errors or other higher numbers of bit errors. In instances in which the read data includes fewer than the threshold number of cells correctable by the ECC, the ECC can correct the erroneous bits prior to finishing the programming operation.

On the other hand, if the ECC check does not result in an ECC pass, e.g., the checked data includes a number of incorrect bits which are not correctable by the ECC or includes more than the threshold number of erroneous bits correctable by the particular ECC, then a check is performed at step 792 of whether the particular count of the number of subsequent check operations has been exceeded. That is, in the embodiment illustrated in FIG. 7, a number, e.g., "Q" in this example, of subsequent erase state checks are performed. In this embodiment, the subsequent erase state checks and subsequent ECC checks are performed until a subsequent ECC check results in a ECC pass or until the subsequent read operations have been repeated Q times. In the embodiment of FIG. 7, Q can be a number such as 3, 5, or 10, among various other numbers.

In the event that the erase state check has not been performed Q times, the erase state failures are corrected and the data is copied to a different location at step 785. After the data is copied to a different location, the erase state check process starts again at step 781.

In the event that the erase state check has been performed Q times, a failure is indicated at step 793. A failure can reduce or prevent the erroneous data from being programmed to a cell which can reduce or prevent the likelihood of later reading incorrect data. In any event, the entire programming operation is completed prior to a reading operation.

FIG. 8 illustrates another flow diagram for performing program operations according to an embodiment of the present disclosure. At step 880 a number of cells are programmed to various final data states. This can include leaving a number of cells in the erased state, which is also referred to as programming a cell to the erased state. The program can be initiated by a control state machine, a memory controller, a processor, etc., associated with the memory array. In various embodiments, a control state machine, controller, etc., and memory array can be integrated into a single chip and/or may be interconnected by buses, among other types of arrangements. The program initiation can result in the generation of a program address, which can be decoded by support circuitry associated with the memory array.

At step 881 an initial erase state check operation is performed subsequent to programming of surrounding cells to final data states. The erase state check is performed at an initial erase state check potential R11, e.g., using an initial erase state check potential of about 0 volts, by applying the initial erase state check potential to the selected word line being checked. That is, the selected cell or cells, e.g., data word, which were programmed to the erased state, corresponding to the requested read address can be checked by having a selected word line potential applied to their associated word line and an initial pass read potential (Vpass_read in FIG. 3) applied to the unselected word lines in the array in order to determine the states of the selected cell or cells.

At step 883 the data from selected cells is checked to determine whether the cells are in the erased state. The erase state check can be implemented in hardware and/or software, and can be performed by circuitry on a memory chip that includes one or more memory arrays. Alternatively, the erase state check can be performed by circuitry of a controller that may or may not be located on a memory chip.

In the event that the erase state check passes, the programming operation can finish at step 890. An erase state check pass can occur when the data indicates that the cell or cells are correctly programmed to the erased state.

On the other hand, if the erase state check does not result in an erase state check pass, e.g., the checked data indicates that the cell or cells are programmed to a data state other than the erased state, then a check is performed at step 891 to determine whether a set of failure criteria have been exceeded. In the embodiment of FIG. 8, the failure criteria could be a limit of one erroneous bit per sector, among other criteria.

In the event the failure criteria are exceeded, the data is copied to a different location according to step 888, which will be described in more detail below.

In the event the failure criteria are not exceeded, the cells surrounding, that is, adjacent to, a target cell that is programmed to the erased state are read at step 886. The read can be initiated by a control state machine, a memory controller, a processor, etc., associated with the memory array. In the embodiment of FIG. 8, a control state machine, controller, etc., and memory array can be integrated into a single chip and/or may be interconnected by buses, among other types of arrangements. The read initiation can result in the generation of a read address, which can be decoded by support circuitry associated with the memory array. The selected cell or cells, e.g., data word, corresponding to the requested read address can be read by having a selected word line potential applied to their associated word line and an initial read potential applied to the unselected word lines in the array in order to determine the states of the selected cell or cells.

At step 887, a read reference shift amount is determined based on the reading of the cells adjacent to the erased cell to be checked. The read reference voltage associated with the erased state is adjusted from R11 to R11+ by the determined read reference shift amount. One of ordinary skill in the art will appreciate that this amount can be determined from information such as the difference in voltage levels between the cells and the physical distance between the cells. As NAND memory arrays are scaled down in size, the distance between cells decreases, and the floating gate—floating gate interference from adjacent cells increases.

At step 882, a subsequent erase state check is performed using the adjusted read reference voltage associated with the erased state, R11+. In the embodiment of FIG. 8, the erase state check potential R11+ can be 0.1V, for example. The erase state check potential is applied to the selected word line being checked. That is, the selected cell or cells, e.g., data word, which were programmed to the erased state, corresponding to the requested read address can be checked by having a selected word line potential applied to their associated word line and an initial pass read potential (Vpass_read in FIG. 3) applied to the unselected word lines in the array in order to determine the states of the selected cell or cells.

After the subsequent erase state check, 882, at step 883 the data from selected cells is checked to determine whether the cells are in the erased state. The erase state check can be implemented in hardware and/or software, and can be performed by circuitry on a memory chip that includes one or more memory arrays. Alternatively, the erase state check can be performed by circuitry of a controller that may or may not be located on a memory chip.

In the event that the erase state check passes, the programming operation can finish at step 890. An erase state check pass can occur when the data indicates that the cell or cells are correctly programmed to the erased state.

On the other hand, if the erase state check does not result in an erase state check pass, e.g., the checked data indicates that the cell or cells are programmed to a data state other than the erased state, then the data is copied to a different location according to step 888, described here in full.

At step 888, the data is copied to a different location in the NAND array. In various embodiments, the location could refer to a different block, page, or sector, among other locations. The data is copied using an adjusted read reference voltage corresponding to the erased state. This adjusted read reference voltage is adjusted by a predetermined amount. In the embodiment of FIG. 8, the predetermined amount is derived from a "worst case scenario" where a cell programmed to the erased state is surrounded by adjacent cells that are all programmed to the highest data state. In this scenario, the cell programmed to the erased state suffers the greatest amount of floating gate—floating gate interference because the difference in voltage level between it and all adjacent cells is maximized. The amount of a read reference shift corresponding to the erased state needed to compensate for the interference is at least the amount that the voltage level of the cell in the erased state is affected by the surrounding adjacent cells in the highest data state.

After the data is copied to a different location, a subsequent erase state check is performed using the predetermined erase read reference voltage at step 889. The erase state check potential is applied to the selected word line being checked. That is, the selected cell or cells, e.g., data word, which were programmed to the erased state, corresponding to the requested read address can be checked by having a selected word line potential applied to their associated word line and an initial pass read potential (Vpass_read in FIG. 3) applied to the unselected word lines in the array in order to determine the states of the selected cell or cells.

After the subsequent erase state check, 889, the data from selected cells is checked to determine whether the cells are in the erased state at step 883. The erase state check can be implemented in hardware and/or software, and can be performed by circuitry on a memory chip that includes one or more memory arrays. Alternatively, the erase state check can be performed by circuitry of a controller that may or may not be located on a memory chip.

In the event that the erase state check passes, the programming operation can finish at step 890. An erase state check pass can occur when the data indicates that the cell or cells are correctly programmed to the erased state.

On the other hand, if the erase state check does not result in an erase state check pass, e.g., the checked data indicates that the cell or cells are programmed to a data state other than the erased state, then a check is performed at step 884 of whether the erroneous bits are correctable by an error code correction technique (ECC). The ECC check can be implemented in hardware and/or software, and can be performed by circuitry on a memory chip that includes one or more memory arrays. Alternatively, the ECC check can be performed by ECC circuitry of a controller that may or may not be located on a memory chip. However, performing the ECC checks on chip may be beneficial due to the increased checking time associated with off chip ECC checking.

In the event that the ECC check passes, the programming operation can finish at step 890. An ECC check pass can occur when the data being read contains a number of erroneous bits which are correctable by the ECC. The threshold number of bits correctable by an ECC can depend on the particular ECC technique or techniques being employed. Some ECC techniques can correct for single bit errors, while others can correct for double bit errors or other higher numbers of bit errors. In instances in which the read data includes fewer than the threshold number of cells correctable by the ECC, the ECC can correct the erroneous bits prior to finishing the programming operation.

On the other hand, if the ECC check does not result in a ECC pass, e.g., the checked data includes a number of incorrect bits which are not correctable by the ECC or includes more than the threshold number of erroneous bits correctable by the particular ECC, then a check is performed at step 892 of whether the particular count of the number of subsequent check operations has been exceeded. That is, in the embodiment illustrated in FIG. 8, a number, e.g., "Q" in this example, of subsequent erase state checks are performed. In this embodiment, the subsequent erase state checks and subsequent ECC checks are performed until a subsequent ECC check results in a ECC pass or until the subsequent read operations have been repeated Q times. In the embodiment of FIG. 8, Q can be a number such as 3, 5, or 10, among various other numbers.

In the event that the erase state check has not been performed Q times, the data is copied to a different location according to step 888, as described above. In the event that the erase state check has been performed Q times, a failure is indicated at step 893. A failure can reduce or prevent the erroneous data from being programmed to a cell which can reduce or prevent the likelihood of later reading incorrect data. In any event, the entire programming operation is completed prior to a reading operation.

Figure 9:
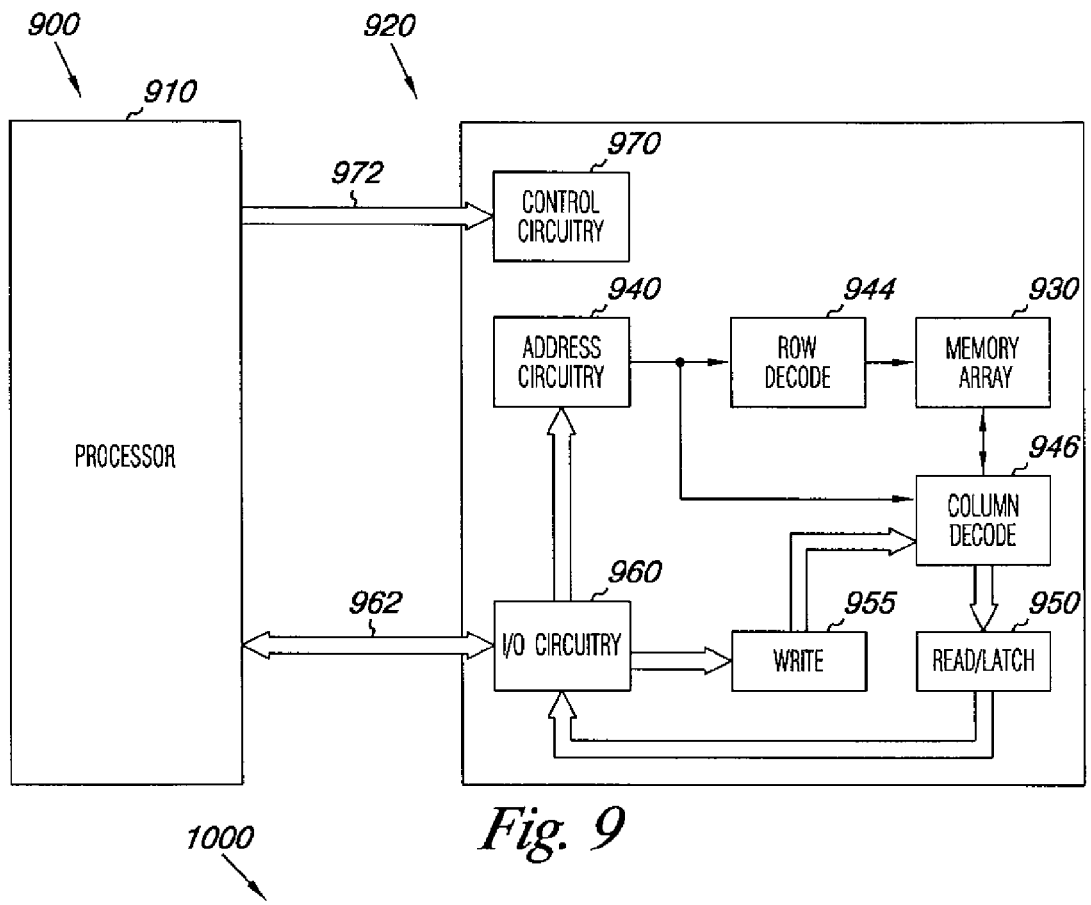
FIG. 9 illustrates a functional block diagram of an electronic memory system having at least one memory device programmed in accordance with an embodiment of the present disclosure.

FIG. 9 illustrates a functional block diagram of an electronic memory system having at least one memory device programmed in accordance with an embodiment of the present disclosure. Memory system 900 includes a processor 910 coupled to a non-volatile memory device 920 that includes a memory array 1030 of non-volatile cells, e.g., a memory array such as array 100 shown in FIG. 1. The memory system 900 can include separate integrated circuits or both the processor 910 and the memory device 920 can be on the same integrated circuit. The processor 910 can be a microprocessor or some other type of controlling circuitry such as an application-specific integrated circuit (ASIC).

For clarity, the electronic memory system 900 has been simplified to focus on features with particular relevance to the present disclosure. The memory device 920 includes an array of non-volatile memory cells 930, which can be floating gate flash memory cells with a NAND architecture. The control gates of each row of memory cells are coupled with a word line, while the drain regions of the memory cells are coupled to bit lines. The source regions of the memory cells are coupled to source lines, as the same has been illustrated in FIG. 1. As will be appreciated by those of ordinary skill in the art, the manner of connection of the memory cells to the bit lines and source lines depends on whether the array is a NAND architecture, a NOR architecture, and AND architecture, or some other memory array architecture.

The embodiment of FIG. 9 includes address circuitry 940 to latch address signals provided over I/O connections 962 through I/O circuitry 960. Address signals are received and decoded by a row decoder 944 and a column decoder 946 to access the memory array 930. As the reader will appreciate, the number of address input connections depends on the density and architecture of the memory array 930 and that the number of addresses increases with both increased numbers of memory cells and increased numbers of memory blocks and arrays.

The memory array 930 includes non-volatile memory cells operated according to embodiments described herein. The memory device 920 reads data in the memory array 930 by sensing voltage and/or current changes in the memory array columns using sense/buffer circuitry that in this embodiment can be read/latch circuitry 950. The read/latch circuitry 950 can be coupled to read and latch a row of data from the memory array 930. I/O circuitry 960 is included for bi-directional data communication over the I/O connections 962 with the processor 910. Write circuitry 955 is included to write, e.g., program, data to the memory array 930.

Control circuitry 970 decodes signals provided by control connections 972 from the processor 910. These signals can include chip signals, write, e.g., program, enable signals, and address latch signals that are used to control the operations on the memory array 930, including read, write, e.g., program, erase, and erase verify operations. In some embodiments, the control circuitry 970 is responsible for executing instructions from the processor 910 to perform the operating and programming embodiments of the present disclosure. The control circuitry 970 can be a state machine, a sequencer, or some other type of controller. It will be appreciated by those skilled in the art that additional circuitry and control signals can be provided, and that the memory device detail of FIG. 9 has been reduced to facilitate ease of illustration.

Figure 10:
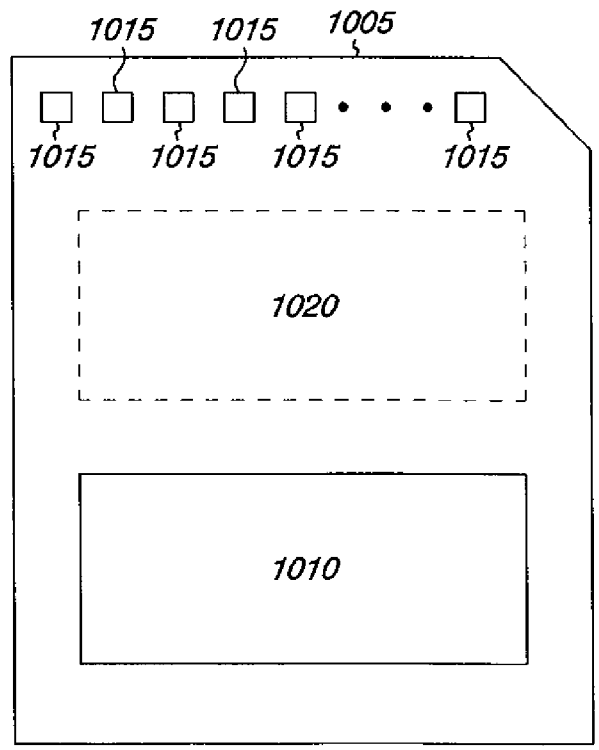
FIG. 10 illustrates a functional block diagram of a memory module having at least one memory device programmed in accordance with an embodiment of the present disclosure.

FIG. 10 illustrates a functional block diagram of a memory module having at least one memory device programmed in accordance with an embodiment of the present disclosure. Memory module 1000 is illustrated as a memory card, although the concepts discussed with reference to memory module 1000 are applicable to other types of removable or portable memory (e.g., USB flash drives) and are intended to be within the scope of "memory module" as used herein. In addition, although one example form factor is depicted in FIG. 10, these concepts are applicable to other form factors as well.

In some embodiments, memory module 1000 will include a housing 1005 (as depicted) to enclose one or more memory devices 1010, though such a housing is not essential to all devices or device applications. At least one memory device 1010 includes an array of non-volatile memory cells read according to embodiments described herein. Where present, the housing 1005 includes one or more contacts 1015 for communication with a host device. Examples of host devices include digital cameras, digital recording and playback devices, PDAs, personal computers, memory card readers, interface hubs and the like. For some embodiments, the contacts 1015 are in the form of a standardized interface. For example, with a USB flash drive, the contacts 1015 might be in the form of a USB Type-A male connector. For some embodiments, the contacts 1015 are in the form of a semi-proprietary interface, such as might be found on Compact-Flash™ memory cards licensed by SanDisk Corporation, Memory Stick™ memory cards licensed by Sony Corporation, SD Secure Digital™ memory cards licensed by Toshiba Corporation and the like. In general, however, contacts 1015 provide an interface for passing control, address and/or data signals between the memory module 1000 and a host having compatible receptors for the contacts 1015.

The memory module 1000 may optionally include additional circuitry 1020, which may be one or more integrated circuits and/or discrete components. For some embodiments, the additional circuitry 1020 may include a memory controller for controlling access across multiple memory devices 1010 and/or for providing a translation layer between an external host and a memory device 1010. For example, there may not be a one-to-one correspondence between the number of contacts 1015 and a number of 1010 connections to the one or more memory devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010 such as logic functions as might be performed by an ASIC. Also, the additional circuitry 1020 may include circuitry to restrict read or write, e.g., program, access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

CONCLUSION

Methods, devices, and systems embodiments for performing a programming operation on an array of non-volatile memory cells have been shown. One method includes programming a number of cells to a number of final data states. The method includes performing, prior to completion of, e.g., finishing, the programming operation, an erase state check on a subset of the number of cells, which were to be programmed to an erased state.

Although specific embodiments have been illustrated and described herein, those of ordinary skill in the art will appreciate that an arrangement calculated to achieve the same results can be substituted for the specific embodiments shown. This disclosure is intended to cover adaptations or variations of some embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the some embodiments of the present disclosure includes other applications in which the above structures and methods are used. Therefore, the scope of some embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating memory cells, comprising:
   programming each of a number of cells to one of a number of final states;
   performing an erase state check on a subset of the number of cells, which were left in an erased state; and
   adjusting a read reference voltage corresponding to the erased state responsive to more than a threshold number of cells within the subset failing the erase state check.

2. The method of claim 1, wherein programming each of the number of cells to one of the number of final states includes leaving the subset of the number of cells in the erased state.

3. The method of claim 2, wherein the method includes:
performing a subsequent erase state check on the subset of cells using the adjusted read reference voltage;
determining whether more than the threshold number of the subset of cells failed the subsequent erase state check; and
performing a subsequent adjustment of the read reference voltage corresponding to the erased state responsive to more than the threshold number of the subset of cells failing the subsequent erase state check.

4. The method of claim 1, wherein data from the number of cells is copied to a different location in the array when more than a threshold number of the subset of cells fail an erase state check, and wherein data stored in cells that fail the erase state check is corrected to the erased state by leaving corresponding cells in the different location in the erased state.

5. The method of claim 1, wherein the method includes:
determining a number of cells that fail the erase state check; and
determining those of number of cells that fail the erase state check are not correctable by error correction code;
wherein adjusting the read reference voltage comprises adjusting the read reference voltage corresponding to the erased state responsive to more than a threshold number of cells within those of the number of cells that fail the erase state check and are not correctable by error correction code failing the erase state check.

6. A method for operating memory cells, comprising:
erasing a number of cells to an erased state;
programming each of a first portion of the number of cells to one of a number of final states;
leaving a second portion of the number of cells in the erased state;
performing an erase state check on the second portion of the number of cells; and
determining whether a threshold number of the second portion of the number of cells failed the erase state check.

7. The method of claim 6, wherein performing the erase state check on the second portion of the number of cells includes performing the erase state check subsequent to erasing the number of cells and subsequent to programming each of the first portion of the number of cells.

8. The method of claim 6, wherein the method includes adjusting a read reference voltage corresponding to the erased state when more than the threshold number of the second portion of the number of cells fail the erase state check.

9. The method of claim 8, wherein adjusting the read reference voltage includes:
reading a number of cells adjacent to a selected cell from the second portion of the number of cells;
determining a read reference shift amount based on reading the cells adjacent to the selected cell; and
adjusting the read reference voltage corresponding to the erased state by the determined read reference shift amount.

10. The method of claim 8, wherein adjusting the read reference voltage includes adjusting the read reference voltage by a predetermined amount.

11. The method of claim 10, wherein the predetermined amount is an amount of a read reference shift for a selected cell necessary for the selected cell to be read correctly when all cells adjacent to the selected cell are programmed to a data state of a plurality of data states, which corresponds to a threshold voltage distribution with a greater difference from a threshold distribution corresponding to the erased state than any other threshold distribution corresponding to one of the data states.

12. The method of claim 6, wherein the method includes:
adjusting a read reference voltage corresponding to the erased state when more than the threshold number of the second portion of the number of cells fail the erase state check;
performing a subsequent erase state check using the adjusted read reference voltage corresponding to the erased state; and
determining whether a threshold number of the second portion of the number of cells failed the subsequent erase state check.

13. A method for operating memory cells, comprising:
programming a number of cells such that a portion of the number of cells are left in an erased state;
performing a first erased state check on the portion of the number of cells using a first read reference voltage for the erased state; and
performing a second erased state check on the portion of the number of cells using a second read reference voltage for the erased state when more than a threshold number of the portion of the number of cells fail the first erased state check.

14. The method of claim 13, wherein performing the first erased state check includes performing the first erased state check after programming the number of cells such that the portion of the number of cells are left in the erased state.

15. A memory device comprising:
an array of memory cells; and
control circuitry coupled to the array and configured to:
erase a number of cells in the array of memory cells;
program a portion of the number of cells;
perform an erase state check on a remainder of the number of cells, wherein the remainder consists of cells left in the erased state; and
determine whether a threshold number of the remainder of cells failed the erase state check.

16. The device of claim 15, wherein the control circuitry is configured to adjust a read reference voltage corresponding to the erased state when more than the threshold number of the remainder of the number of cells fail the erase state check.

17. The device of claim 16, wherein the control circuitry is configured to:
perform a subsequent erase state check using the adjusted read reference voltage corresponding to the erased state; and
determine whether a threshold number of the remainder of the number of cells failed the subsequent erase state check.

18. The device of claim 15, wherein the control circuitry is configured to copy the data from the number of cells to a different location in the array when more than the threshold number of the remainder of the number of cells fail the erase state check.

19. The device of claim 15, wherein the control circuitry is configured to:
perform an error correction code check to determine whether a particular cell that fails the erase state check is correctable; and
discount the cell particular cell from the threshold number in response to a determination that the particular cell is error correction code correctable.

20. A memory device, comprising:
at least one array of memory cells; and
control circuitry coupled to the array and configured to:
  program a number of cells;
  perform an erase state check on a subset of the number of cells, which were left in an erased state; and
  adjust a read reference voltage corresponding to the erased state when more than a threshold number of the subset of cells fail the erase state check.

21. The device of claim 20, wherein the control circuitry is configured to:
  read a number of cells adjacent to a selected cell of the subset;
  determine a read reference voltage shift amount based on the reading of the number of cells adjacent to the selected cell; and
  adjust the read reference voltage corresponding to the erased state by the determined read reference voltage shift amount.

22. The device of claim 20, wherein the control circuitry is configured to adjust the read reference voltage corresponding to the erased state by an amount of a read reference shift for a selected cell necessary for the selected cell to be read correctly when all cells adjacent to the selected cell are programmed to a data state corresponding to a threshold voltage distribution with a greater difference from a threshold distribution corresponding to the erased state than any other threshold distribution corresponding to any other data state.

23. The device of claim 20, wherein the control circuitry is configured to:
  perform a subsequent erase state check using the adjusted read reference voltage corresponding to the erased state; and
  determine whether a threshold number of the subset of cells failed the subsequent erase state check.

24. The device of claim 20, wherein the control circuitry is configured to copy the data from the number of cells to a different location in the array when more than the threshold number of the subset of cells fail the erase state check.

25. The device of claim 20, wherein the control circuitry is configured to perform an error correction technique on a number of cells that fail the erase state check when the number of cells that fail the erase state check are fewer than a threshold number correctable by error code correction.

* * * * *